United States Patent
Xie et al.

(10) Patent No.: US 11,610,947 B2
(45) Date of Patent: Mar. 21, 2023

(54) ORGANIC LIGHT-EMITTING DISPLAY PANEL COMPRISING VIA HOLE IN NON-DISPLAY AREA, METHOD FOR PREPARING THE SAME AND DISPLAY DEVICE

(71) Applicant: BOE Technology Group Co., Ltd., Beijing (CN)

(72) Inventors: Chunyan Xie, Beijing (CN); Song Zhang, Beijing (CN); Pinfan Wang, Beijing (CN); Tao Wang, Beijing (CN); Penghao Gu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 154 days.

(21) Appl. No.: 16/766,797

(22) PCT Filed: Dec. 26, 2019

(86) PCT No.: PCT/CN2019/128856
§ 371 (c)(1),
(2) Date: May 26, 2020

(87) PCT Pub. No.: WO2020/147549
PCT Pub. Date: Jul. 23, 2020

(65) Prior Publication Data
US 2021/0193760 A1    Jun. 24, 2021

(30) Foreign Application Priority Data

Jan. 18, 2019  (CN) .......................... 201910049031.9

(51) Int. Cl.
*H01L 27/32*    (2006.01)
*H01L 51/00*    (2006.01)
(Continued)

(52) U.S. Cl.
CPC ........ *H01L 27/3246* (2013.01); *H01L 51/001* (2013.01); *H01L 51/0018* (2013.01);
(Continued)

(58) Field of Classification Search
CPC .............. H01L 27/3246; H01L 51/001; H01L 51/0018; H01L 51/0097; H01L 51/5253;
(Continued)

(56) References Cited

U.S. PATENT DOCUMENTS

2018/0061907 A1    3/2018  Kim et al.
2018/0159086 A1    6/2018  Cho
(Continued)

FOREIGN PATENT DOCUMENTS

CN    104733497 A    6/2015
CN    106653820 A    5/2017
(Continued)

OTHER PUBLICATIONS

Chinese Office Action dated Jun. 28, 2021 in related Chinese Application No. 201910049031.9.
Chinese Office Action dated Jun. 29, 2020 in related Chinese Application No. 201910049031.9.

*Primary Examiner* — Nduka E Ojeh
(74) *Attorney, Agent, or Firm* — ArentFox Schiff LLP; Michael Fainberg

(57) ABSTRACT

The present disclosure provides an organic light-emitting display panel, a method for preparing the same and a display device. The method includes: providing a substrate, where the substrate includes a non-display area and a display area surrounding the non-display area; forming a barrier layer and a pixel circuit on the substrate, where an orthographic projection of the pixel circuit on the substrate and an orthographic projection of the non-display area on the substrate do not overlap; patterning the barrier layer in the
(Continued)

non-display area to form at least one via hole penetrating the barrier layer; patterning the substrate by using the barrier layer as a mask in the non-display area to form a groove; forming a light emitting layer on the pixel circuit; and forming a thin film encapsulation layer covering the light emitting layer and the side wall of the draw-in structure on the light emitting layer.

16 Claims, 8 Drawing Sheets

(51) Int. Cl.
  *H01L 51/52* (2006.01)
  *H01L 51/56* (2006.01)
(52) U.S. Cl.
  CPC ...... *H01L 51/0097* (2013.01); *H01L 51/5253* (2013.01); *H01L 51/56* (2013.01); *H01L 2251/5338* (2013.01); *H01L 2251/558* (2013.01)
(58) Field of Classification Search
  CPC ................. H01L 51/56; H01L 51/0017; H01L 2251/5338; H01L 2251/558; H01L 2227/323; Y02E 10/549
  USPC .......................................................... 257/40
  See application file for complete search history.

(56) References Cited

U.S. PATENT DOCUMENTS

| | | | |
|---|---|---|---|
| 2018/0324700 A1 | 11/2018 | Yu et al. | |
| 2019/0013374 A1 | 1/2019 | Park et al. | |
| 2019/0074460 A1 | 3/2019 | Cai et al. | |
| 2019/0081121 A1* | 3/2019 | Choi | H01L 27/3262 |
| 2019/0288047 A1* | 9/2019 | Jeong | H01L 51/5256 |
| 2019/0334120 A1* | 10/2019 | Seo | G06F 3/0444 |
| 2020/0006684 A1* | 1/2020 | Liu | H01L 27/3276 |
| 2020/0176529 A1* | 6/2020 | Choi | H01L 27/3234 |
| 2020/0176711 A1 | 6/2020 | Wang et al. | |
| 2020/0303676 A1* | 9/2020 | Lin | H01L 51/502 |
| 2020/0365825 A1* | 11/2020 | Yu | H01L 51/5253 |
| 2021/0234122 A1* | 7/2021 | Choi | H01L 51/5253 |

FOREIGN PATENT DOCUMENTS

| | | |
|---|---|---|
| CN | 106876598 A | 6/2017 |
| CN | 107799555 A | 3/2018 |
| CN | 108417731 A | 8/2018 |
| CN | 108417733 A | 8/2018 |
| CN | 108538899 A | 9/2018 |
| CN | 108649133 A | 10/2018 |
| CN | 108649141 A | 10/2018 |
| CN | 109786427 A | 5/2019 |

* cited by examiner

ORGANIC LIGHT-EMITTING DISPLAY PANEL COMPRISING VIA HOLE IN NON-DISPLAY AREA, METHOD FOR PREPARING THE SAME AND DISPLAY DEVICE

The present disclosure is a US National Stage of International Application No. PCT/CN2019/128856, filed on Dec. 26, 2019, which claims the priority of a Chinese patent application filed in the China National Intellectual Property Administration on Jan. 18, 2019 with publication number 201910049031.9 and application name "Method For Preparing Organic Light-Emitting Diode Display Device and Display Device", the entire contents of which are hereby incorporated by reference.

FIELD

The present disclosure relates to the display field, in particular to an organic light-emitting display panel, a method for preparing the same and a display device.

BACKGROUND

Organic light-emitting display panels have been increasingly applied to display devices for numerous advantages. As a concept of "full screen" is proposed, organic light-emitting display panels integrated with functional devices are worth further research.

SUMMARY

An embodiment of the present disclosure provides a method for preparing an organic light-emitting display panel, including:

providing a substrate, where the substrate includes a non-display area and a display area surrounding the non-display area;

forming a barrier layer and a pixel circuit on the substrate, where an orthographic projection of the pixel circuit on the substrate and an orthographic projection of the non-display area on the substrate do not overlap;

patterning the barrier layer in the non-display area to form at least one via hole penetrating the barrier layer;

patterning the substrate by using the barrier layer as a mask in the non-display area to form a groove; where the groove is in a position, corresponding to the via hole, of the substrate, an opening width of a side, close to the barrier layer, of the groove is larger than a width of the via hole, and the groove and the barrier layer form an undercut structure;

forming a light emitting layer on the pixel circuit, where the light emitting layer is disconnected at a side wall of the undercut structure; and forming a continuous thin film encapsulation layer covering the light emitting layer and the side wall of the undercut structure on the light emitting layer.

Optionally, in the embodiment of the present disclosure, said forming the pixel circuit on the substrate includes:

forming a plurality of films of the pixel circuit on the substrate, and sequentially patterning the plurality of films, where the plurality of films include a metal layer, a semiconductor layer and an insulating layer;

where in the non-display area, the metal layer is removed in an exposure process.

Optionally, in the embodiment of the present disclosure, said patterning the substrate by using the barrier layer as a mask includes:

etching the substrate in a dry etching process by using the barrier layer as the mask.

Optionally, in the embodiment of the present disclosure, said forming the light emitting layer on the pixel circuit includes:

forming the light emitting layer on the pixel circuit by an evaporation method.

Optionally, in the embodiment of the present disclosure, the thin film encapsulation layer includes at least one organic layer and at least one inorganic layer which are alternately stacked.

Optionally, in the embodiment of the present disclosure, the thin film encapsulation layer includes a first inorganic layer, an organic layer, and a second inorganic layer arranged on a side, facing away from the first inorganic layer, of the organic layer.

Optionally, in the embodiments of the present disclosure, said forming the thin film encapsulation layer on the light emitting layer includes:

forming the first inorganic layer on the light emitting layer by a vapor deposition method;

forming the organic layer on the first inorganic layer by means of ink-jet printing; and forming the second inorganic layer on the organic layer by the vapor deposition method.

Optionally, in the embodiments of the present disclosure, in a direction perpendicular to the barrier layer, a thickness of the groove ranges from 2 μm to 5 μm, or the thickness of the groove ranges from 20% to 80% of a thickness of the substrate.

Optionally, in the embodiment of the present disclosure, in a direction parallel to the barrier layer, a width of side erosion of a side, near the pixel circuit, of the undercut structure ranges from 0.3 μm to 3 μm.

Optionally, in the embodiment of the present disclosure, the substrate is a flexible substrate.

Optionally, in the embodiment of the present disclosure, an inorganic insulating layer in the pixel circuit is reused as the barrier layer.

Optionally, in the embodiment of the present disclosure, a material of the barrier layer is a silicon nitride material or a silicon oxide material.

Correspondingly, an embodiment of the present disclosure also provides an organic light-emitting display panel, including:

a substrate, where the substrate includes a non-display area and a display area surrounding the non-display area;

a barrier layer, where the barrier layer is arranged on the substrate, and the non-display area includes at least one via hole, where a position, corresponding to the via hole, of the substrate includes a groove, and the groove and the barrier layer form an undercut structure;

a pixel circuit, where an orthographic projection of the pixel circuit on the substrate and an orthographic projection of the non-display area on the substrate do not overlap;

a light emitting layer, where the light emitting layer is arranged on a side, facing away from the substrate, of the pixel circuit, and the light emitting layer is disconnected at a side wall of the undercut structure; and a thin film encapsulation layer, where the thin film encapsulation layer covers the light emitting layer and the side wall of the undercut structure and is continuously arranged.

Optionally, in the embodiment of the present disclosure, in a direction perpendicular to the barrier layer, a thickness of the groove ranges from 2 μm to 5 μm, or the thickness of the groove ranges from 20% to 80% of a thickness of the substrate.

Optionally, in the embodiment of the present disclosure, in a direction parallel to the barrier layer, a width of side erosion of a side, near the pixel circuit, of the undercut structure ranges from 0.3 μm to 3 μm.

Optionally, in the embodiment of the present disclosure, the thin film encapsulation layer includes at least one organic layer and at least one inorganic layer which are alternately stacked.

Optionally, in the embodiment of the present disclosure, the thin film encapsulation layer includes a first inorganic layer, an organic layer, and a second inorganic layer arranged on a side, facing away from the first inorganic layer, of the organic layer.

Correspondingly, an embodiment of the present disclosure also provides a display device, including the organic light-emitting display panel provided by the embodiments of the present disclosure.

DETAILED DESCRIPTION OF THE EMBODIMENTS

In the related art, the application of an organic light-emitting display panel in full-screen display can maximize a display area and reduce the area of a border area. However, in order to enable a display device where the organic light-emitting display panel is located to realize other functions besides display, such as a front camera function, it is necessary to make a hole in the organic light-emitting display panel to accommodate a front camera.

Figure 1:
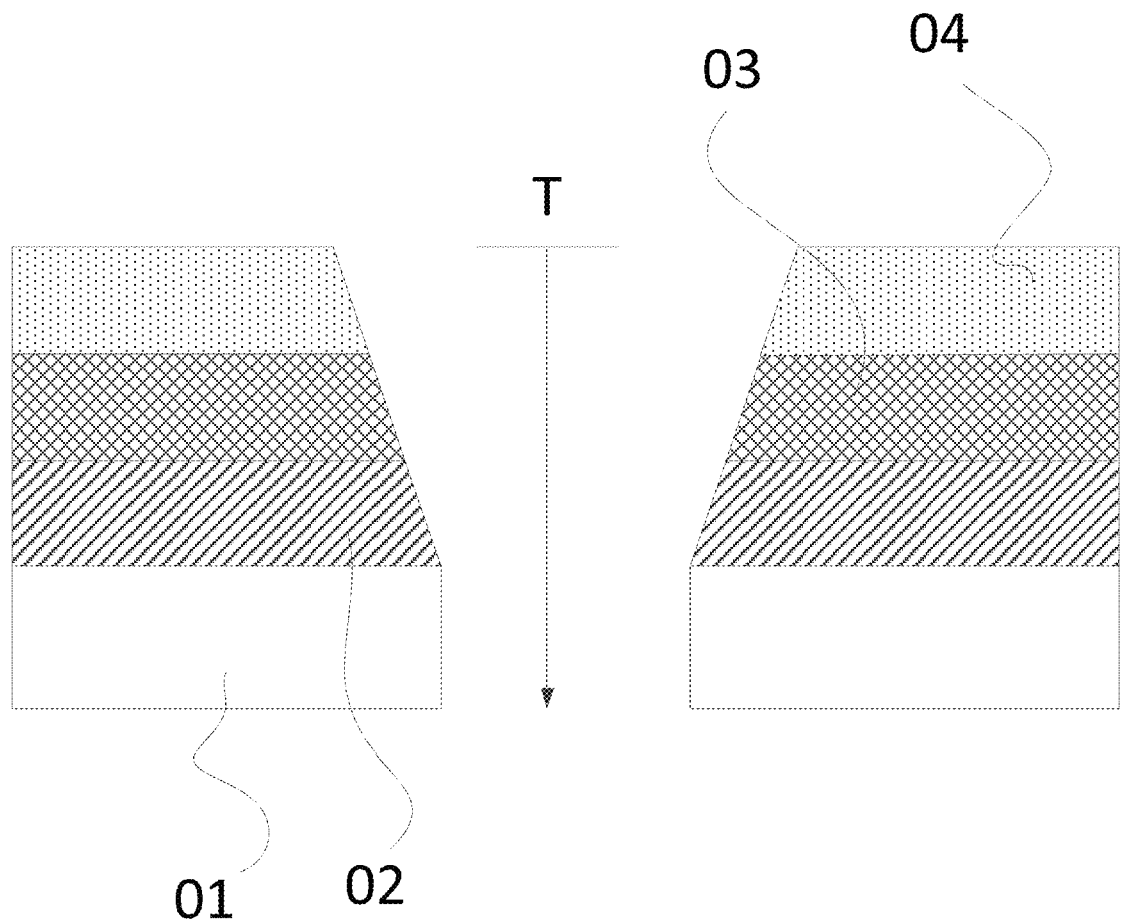
FIG. 1 is a structural schematic diagram of a perforated portion of an organic light-emitting display panel in the related art.

A structure of the organic light-emitting display panel in the related art is shown in FIG. 1, where the organic light-emitting display panel includes a substrate 01, and a pixel circuit layer 02, an organic light emitting layer 03, and an encapsulation layer 04 which are sequentially located on the substrate 01. A via hole directly penetrating the substrate 01, the pixel circuit layer 02, the organic light emitting layer 03 and the encapsulation layer 04 is formed at a preset position of the organic light-emitting display panel to accommodate other functional devices, such as a front camera.

However, the arrangement of the via hole makes the organic light emitting layer directly exposed to the air, so that the organic light emitting layer is susceptible to water and oxygen, resulting in the failure of a light emitting device in the organic light-emitting display panel to affect a display effect of the organic light-emitting display panel.

Based on the above problems of the organic light-emitting display panel in the related art, the embodiments of the present disclosure provide an organic light-emitting display panel, a method for preparing the same and a display device. In order to make the purpose, technical solutions and advantages of the present disclosure clearer, the specific implementations of the organic light-emitting display panel, the method for preparing the same and the display device provided by the embodiments of the present disclosure will be described in detail below with reference to the accompanying drawings. It should be understood that the preferred embodiments described below are only configured to illustrate and explain the present disclosure, rather than to limit the present disclosure. Besides, the embodiments in the present application and the features in the embodiments may be combined with each other without conflict.

Unless otherwise defined, technical terms or scientific terms used in the present disclosure shall have the ordinary meaning understood by those having ordinary skill in the field to which the present disclosure belongs. The words "first", "second" and the like used in the present disclosure do not indicate any order, quantity or importance, but are only used to distinguish different components. Words "comprise" or "include" mean that elements or articles appearing before the words cover elements or articles listed after the words and their equivalents, and do not exclude other elements or articles. Words "connect" and the like are not limited to physical or mechanical connection, but may include electrical connection, whether direct connection or indirect connection. Words "up", "down", "left", "right" and the like are only used to indicate the relative positional relationship, and when the absolute position of a described object changes, the relative positional relationship may also change accordingly.

The shapes and sizes of the components in the accompanying drawings do not reflect true proportions, and are only for the purpose of schematically illustrating the present disclosure.

Figure 2:
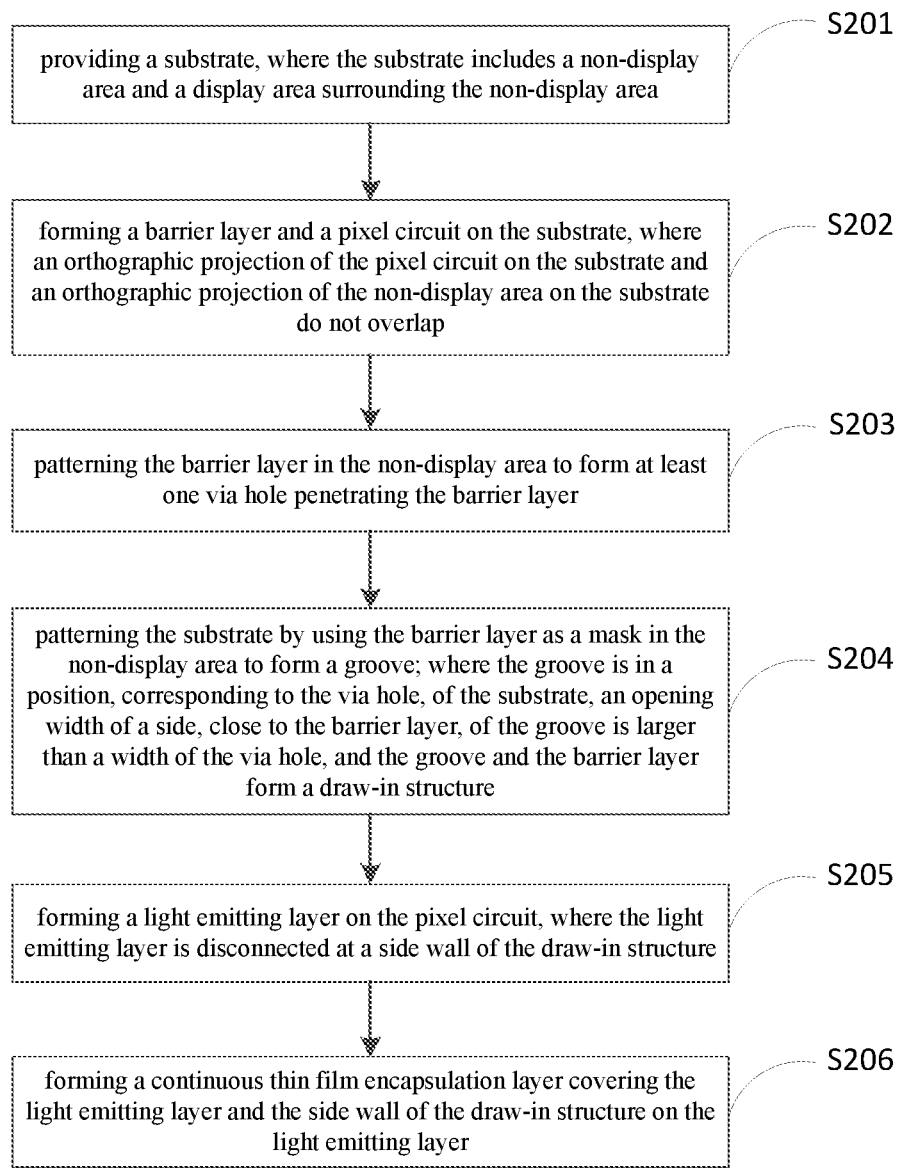
FIG. 2 is a flowchart of a method for preparing an organic light-emitting display panel provided by the present disclosure.

As shown in FIG. 2, the present disclosure provides a method for preparing an organic light-emitting display panel, including steps S201 to S206 as follows.

S201, providing a substrate, where the substrate includes a non-display area and a display area surrounding the non-display area.

S202, forming a barrier layer and a pixel circuit on the substrate, where an orthographic projection of the pixel circuit on the substrate and an orthographic projection of the non-display area on the substrate do not overlap.

Figure 3A:
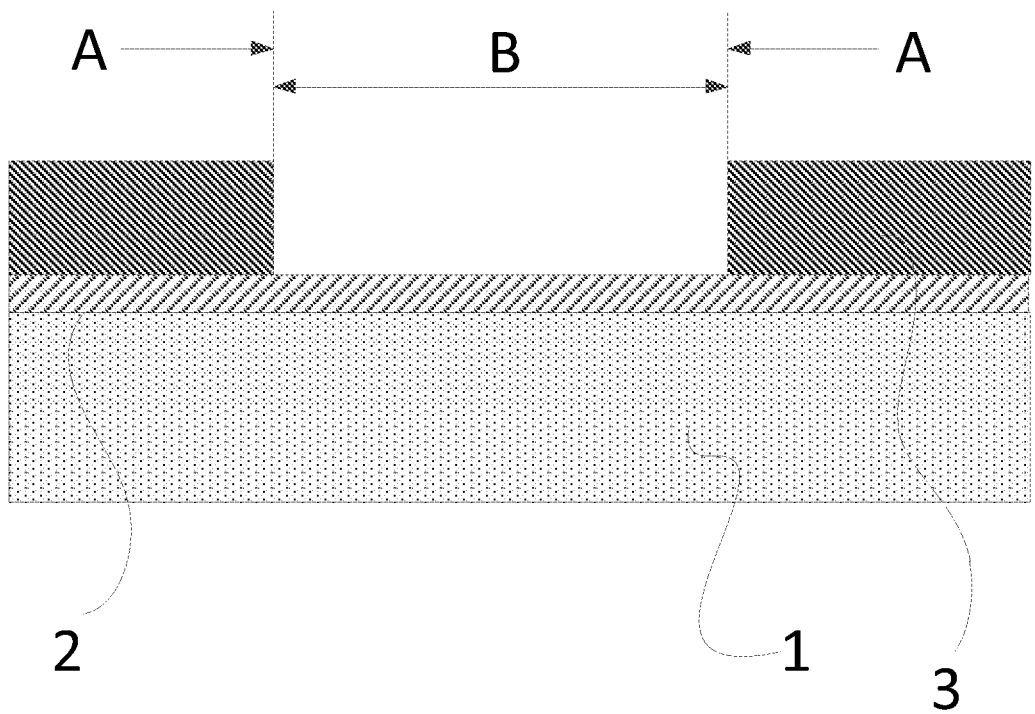
FIGS. 3a to 3e are structural schematic diagrams corresponding to a preparation process of the organic light-emitting display panel provided by an embodiment of the present disclosure.

As shown in FIG. 3a, the barrier layer 2 and the pixel circuit 3 are sequentially formed on the substrate 1, the pixel circuit 3 is located only in the display area A, and a portion covering the non-display area B needs to be etched away during a preparation process, so as to facilitate the patterning of the barrier layer 2 and the substrate 1 later.

Figure 6:
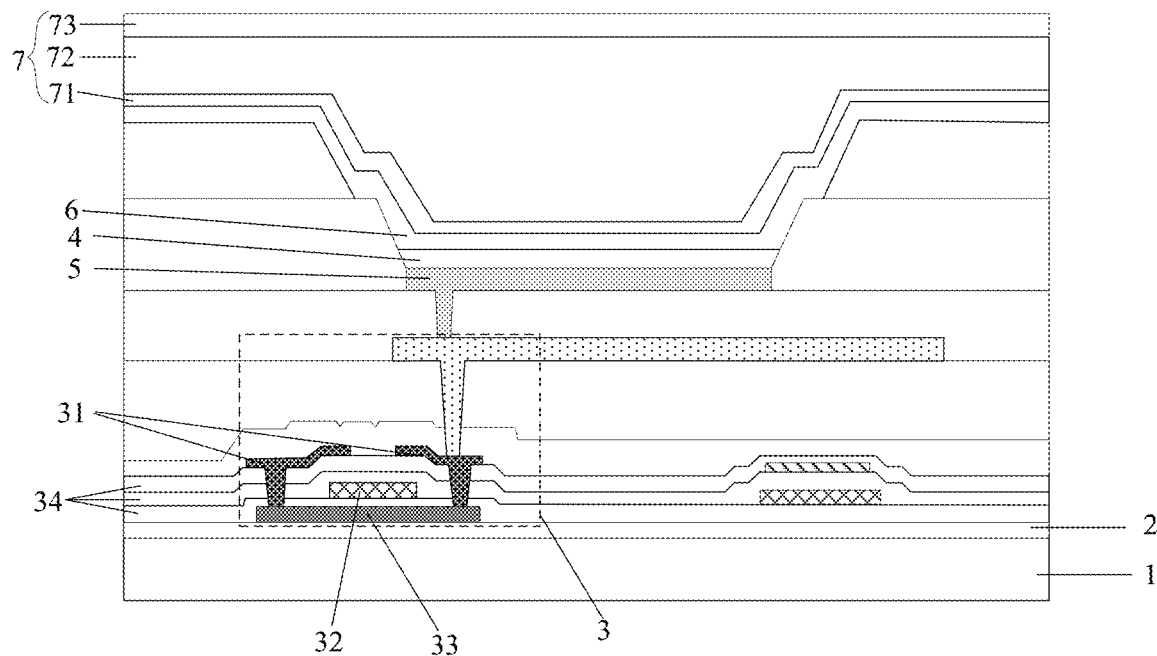
FIG. 6 is a structural schematic diagram of a display area of an organic light-emitting display panel provided by an embodiment of the present disclosure.

It should be noted that FIG. 3a only schematically shows the location of the pixel circuit 3, and does not specifically show each film in the pixel circuit 3, where the pixel circuit 3 includes a plurality of films, such as a semiconductor layer, a metal layer and an insulating layer. As shown in FIG. 6, the pixel circuit 3 in the display area A includes a semiconductor layer 33, insulating layers 34, and metal layers, such as a gate electrode 32 and source-drain electrodes 31.

S203, patterning the barrier layer in the non-display area to form at least one via hole penetrating the barrier layer.

Figure 3B:
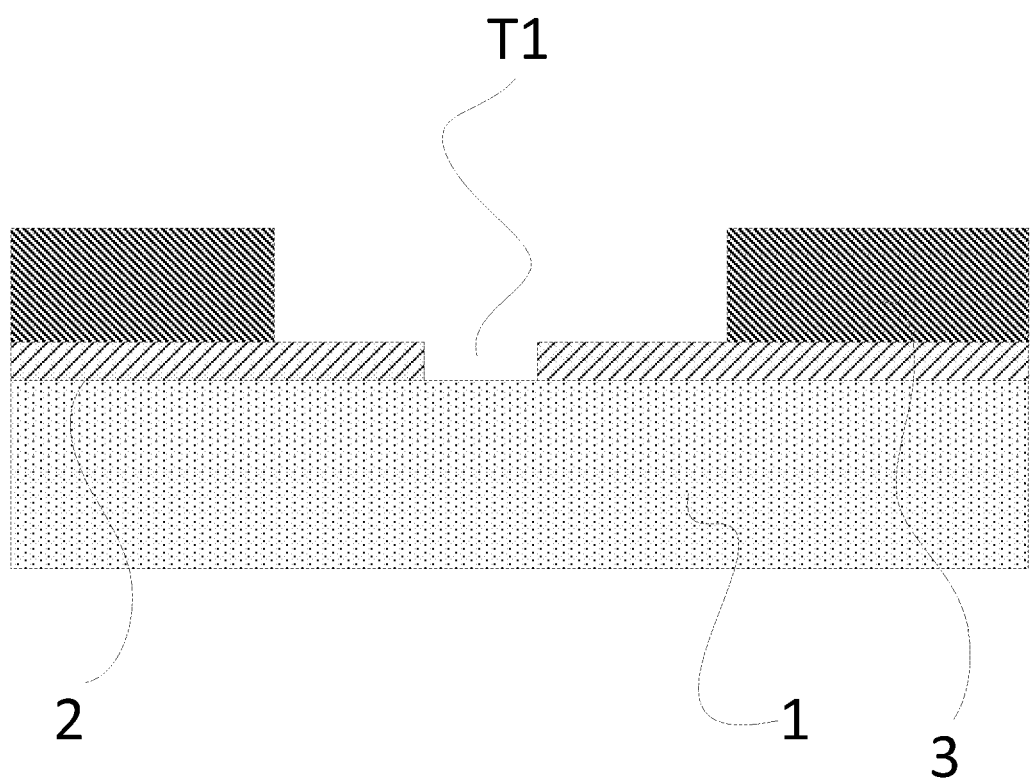

As shown in FIG. 3b, the barrier layer 2 is patterned, at least one via hole T1 penetrating the barrier layer 2 is formed in a portion, located in the non-display area B, of the barrier layer 2, and the corresponding via hole T1 can be etched at a preset position by dry etching.

Figure 4:
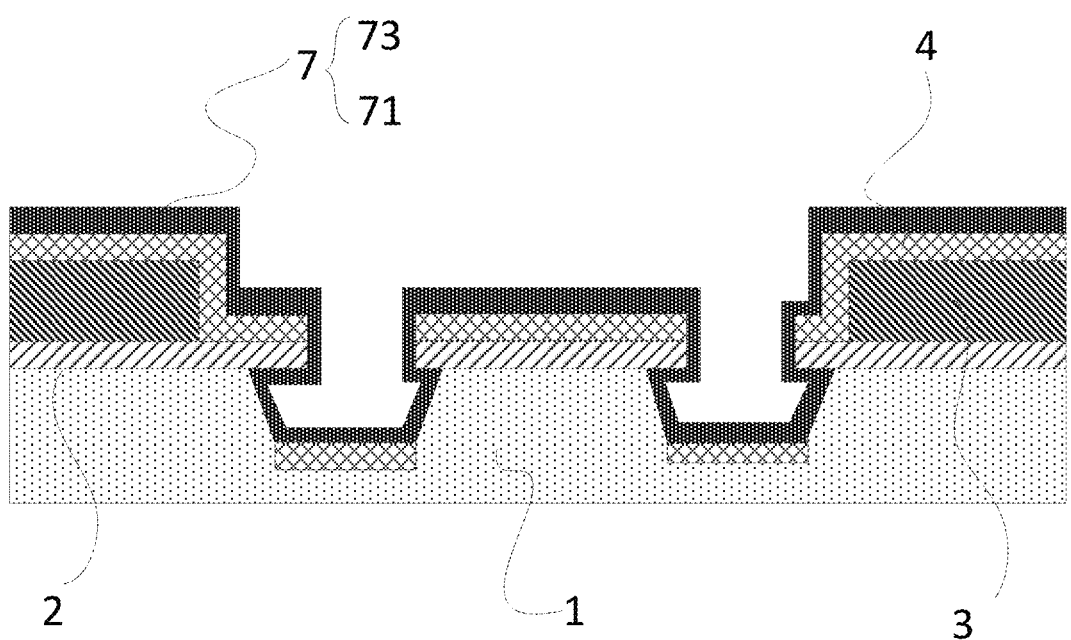
FIG. 4 is a structural schematic diagram of another organic light-emitting display panel provided by an embodiment of the present disclosure.

FIG. 3b conducts illustration by taking etching of one via hole T1 as an example, but a plurality of via holes T1 may exist (as shown in FIG. 4). When the barrier layer 2 includes only one via hole T1, an area occupied by the via hole T1 will be quite large, so that when perforation is conducted later to accommodate functional devices, the perforation area will entirely fall within the area where the via hole T1 is located. When the barrier layer 2 includes a plurality of via holes T1, a coverage area of each via hole T1 will be smaller, so that when perforation is conducted later to accommodate functional devices, only an edge of the perforation area falls within the area where the via holes T1 are located, and therefore, the light emitting layer in the display area can be prevented from being exposed to the air.

S204, patterning the substrate by using the barrier layer as a mask in the non-display area to form a groove; where the groove is in a position, corresponding to the via hole, of the substrate, an opening width of a side, close to the barrier layer, of the groove is larger than a width of the via hole, and the groove and the barrier layer form an undercut structure.

Figure 3C:
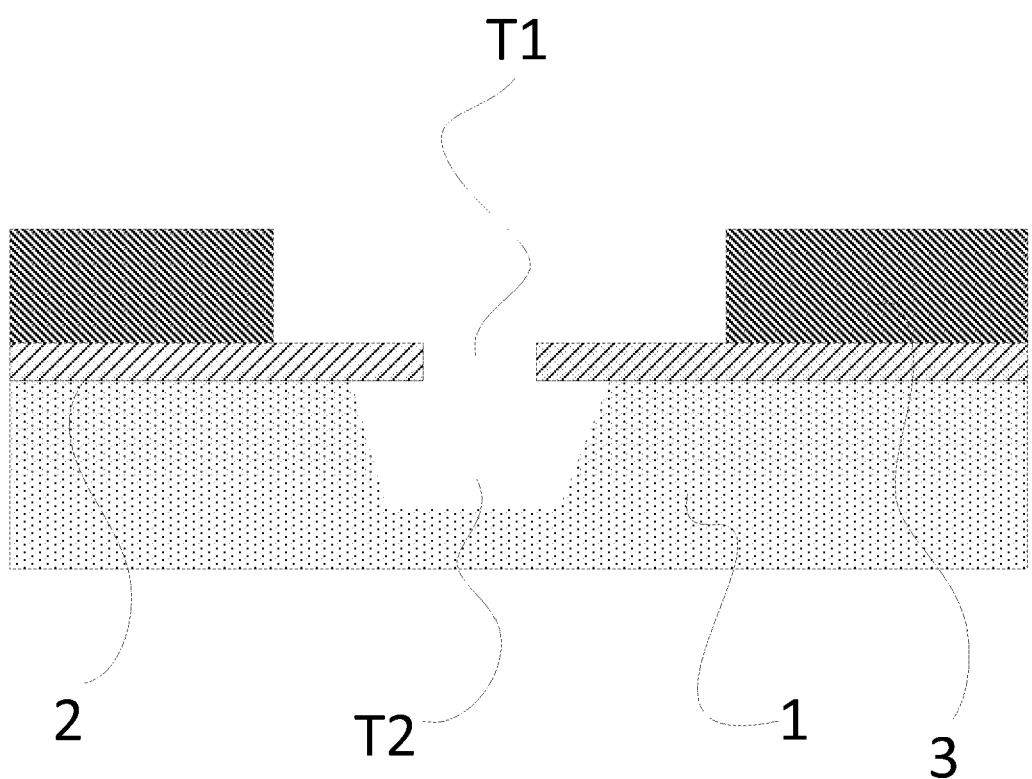

As shown in FIG. 3c, by using the barrier layer 2 as the mask, the groove T2 corresponding to the via hole T1 is formed in the substrate 1, and the groove T2 and the barrier layer 2 form the undercut structure which is beneficial to the patterning of a light emitting layer and a thin film encapsulation layer.

S205, forming a light emitting layer on the pixel circuit, where the light emitting layer is disconnected at a side wall of the undercut structure.

Figure 3D:
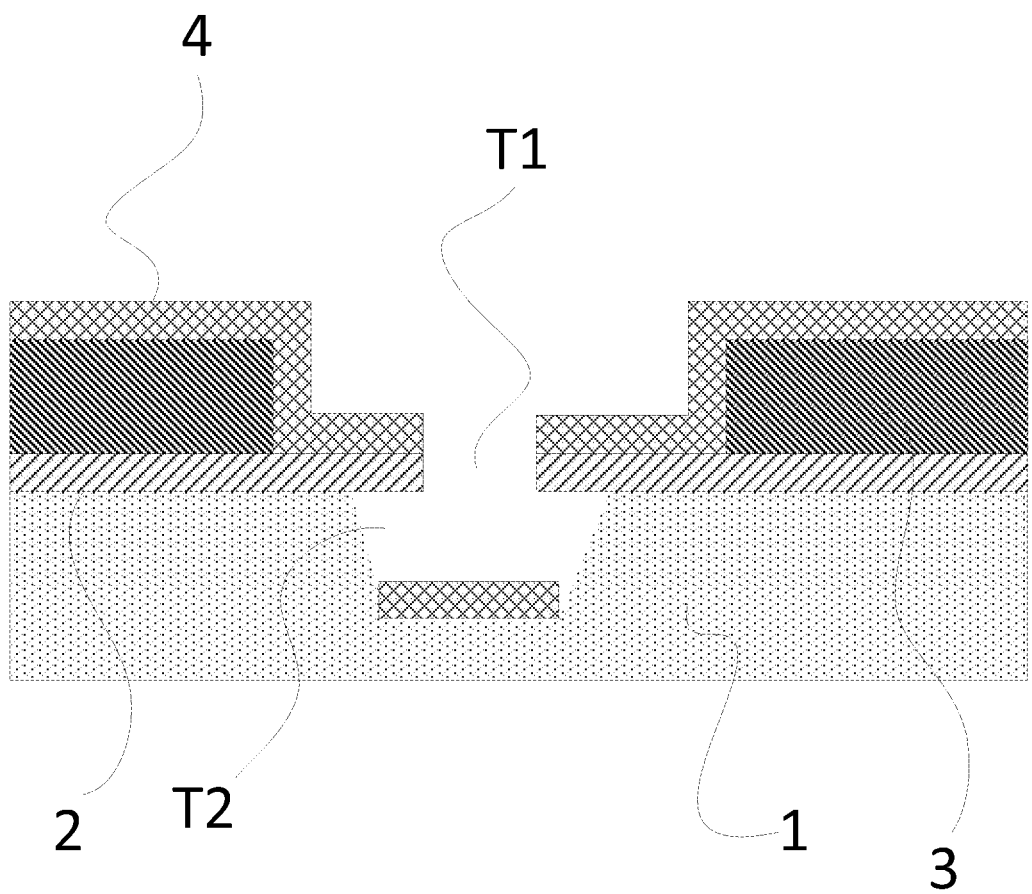

As shown in FIG. 3d, the light emitting layer 4 can be formed on a side, facing away from the substrate 1, of the pixel circuit 3 after the undercut structure is formed. Due to the existence of the undercut structure, when the light emitting layer 4 is formed, the light emitting layer 4 can be disconnected at the side wall of the undercut structure by adopting an appropriate process. Optionally, the display area AA of the organic light-emitting display panel further includes a light-emitting device located on a side, facing away from the substrate 1, of the pixel circuit 3; and the light-emitting device includes a first electrode 5, the light emitting layer 4 and a second electrode 6.

S206, forming a continuous thin film encapsulation layer covering the light emitting layer and the side wall of the undercut structure on the light emitting layer.

Figure 3E:
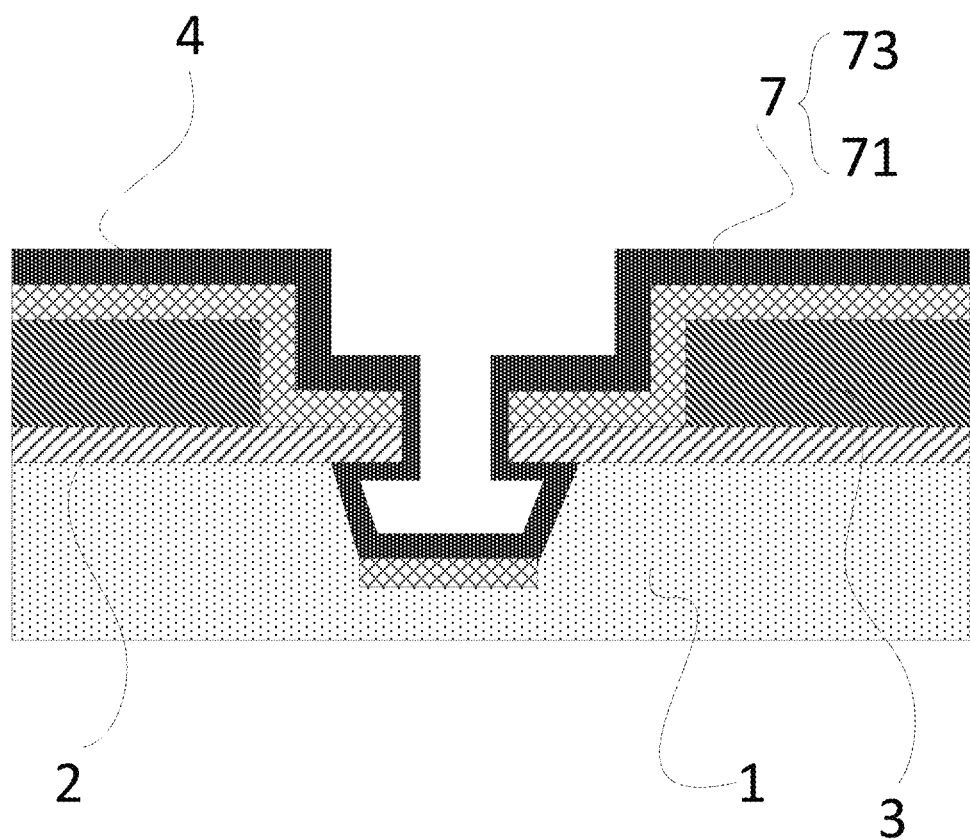

As shown in FIG. 3e, after the light emitting layer 4 is formed, the thin film encapsulation layer 7 may be formed on the light emitting layer 4, and the thin film encapsulation layer 7 covers not only the light emitting layer 4 but also the side wall of the undercut structure. In this way, when the via hole for accommodating functional devices is made later, cutting can be carried out at a position of an opening of the undercut structure. The portion, exposed after cutting, of the light emitting layer 4 is the light emitting layer located at the bottom of the undercut structure, and this portion of the light emitting layer is not used for display. However, a portion, on the pixel circuit 3, of the light emitting layer 4 is still covered by the thin film encapsulation layer 7, which can effectively prevent the invasion of water and oxygen and is beneficial to prolonging the service life of the organic light-emitting display panel.

Figure 5:
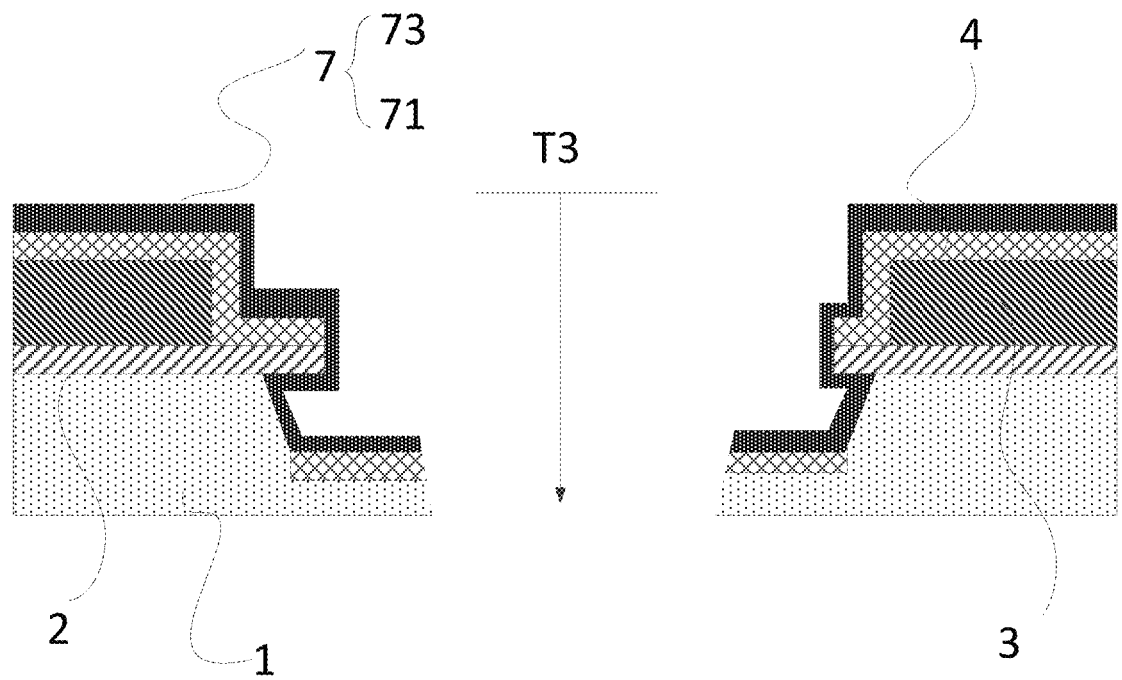
FIG. 5 is a structural schematic diagram after conducting perforation on FIG. 4.

Specifically, as shown in FIG. 4, an organic light-emitting display panel with a plurality of undercut structures is provided. When a via hole T3 for containing functional devices (such as a front camera) is formed, an edge of the area where the via hole T3 is located falls into the undercut structures. A structure after cutting is shown in FIG. 5, where a portion, at the bottom of the undercut structures, of the light emitting layer 4 is exposed to the air, while a portion, located on the pixel circuit 3, of the light emitting layer 4 is still covered by the thin film encapsulation layer 7. The portion, exposed to the air, of the light emitting layer 4 is not used for display, while the portion, used for display, of the light emitting layer 4 is not exposed to the air. In this way, a light emitting device in the organic light-emitting display panel will not fail due to the cutting of the via hole.

Optionally, in the method for preparing the organic light-emitting display panel provided by the embodiment of the present disclosure, the forming the pixel circuit on the substrate specifically includes:

forming a plurality of films of the pixel circuit on the substrate, and sequentially patterning the plurality of films, where the plurality of films include a metal layer, a semiconductor layer and an insulating layer;

where in the non-display area, the metal layer is removed in an exposure process.

For example, as shown in FIG. 3a, the metal layers (such as the gate electrode and source-drain electrodes) in the pixel circuit 3 in the non-display area B have been removed in an exposure process, That is, before etching the substrate using a barrier layer pattern as the mask, all metal films, located in the non-display area, of the pixel circuit are removed to prevent other portions that do not need etching from being etched away due to the ductility of the metal films in the etching process.

It should be noted that the barrier layer provided by the embodiment of the present disclosure may be separately arranged, or may reuse an inorganic insulating layer in the pixel circuit, such as a gate insulating layer, an interlayer insulating layer, or a passivation layer. When separately arranged, the barrier layer can be directly formed on the substrate, and then the films of the pixel circuit are formed on the barrier layer; and when the inorganic insulating layer in the pixel circuit is reused as the barrier layer, the hierarchical relationship between the films in the pixel circuit and the barrier layer is related to the type and wiring of each transistor in the pixel circuit. Taking a gate insulating layer reused as the barrier layer as an example, when each transistor is a bottom gate transistor, a gate layer is located between the barrier layer and the substrate, and a semiconductor layer and source and drain layers are located above the barrier layer; and when each transistor is a top gate transistor, the semiconductor layer and the source and drain layers are positioned between the barrier layer and the substrate, and the gate layer is positioned above the barrier layer. The relative positional relationship between the barrier layer and the films of the pixel circuit can be determined according to actual needs and is not specifically limited here.

Optionally, in the method for preparing the organic light-emitting display panel provided by the embodiment of the present disclosure, the patterning the substrate by using the barrier layer as a mask specifically includes:

etching the substrate in a dry etching process by using the barrier layer as the mask.

Specifically, the substrate is etched through a dry etching process by using the barrier layer as the mask. Dry etching has the advantages of good anisotropy, high selection ratio, good controllability, flexibility and repeatability, no pollution in the treatment process, high cleanliness and the like, and can ensure that the selected portions are accurately etched and other portions are not affected by an etching environment in an etching process of the substrate.

Optionally, in the method for preparing the organic light-emitting display panel provided by the embodiment of the present disclosure, the forming the light emitting layer on the pixel circuit specifically includes:

forming the light emitting layer on the pixel circuit by an evaporation method.

Specifically, the light emitting layer formed by the evaporation method has good verticality and the condition that the formed light emitting layer is disconnected at the side wall of the undercut structure can be effectively ensured.

Optionally, in the method for preparing the organic light-emitting display panel provided by the embodiment of the present disclosure, in a direction perpendicular to the barrier layer, the thickness of the groove ranges from 2 μm to 5 μm, or the thickness of the groove ranges from 20% to 80% of the thickness of the substrate.

Specifically, according to the overall thickness of the substrate, the etching thickness of the substrate can range from 2 μm to 5 μm. As the mask is used for etching, the etching thickness ranging from 2 μm to 5 μm can better control an etching speed and an etching end point, so as to ensure that underlying materials are not damaged. Of course, when the overall thickness of the substrate changes, the thickness of the groove will also change accordingly, and the specific thickness of the groove is not limited here.

Optionally, in the method for preparing the organic light-emitting display panel provided by the embodiment of the present disclosure, in a direction parallel to the barrier layer, a width of side erosion of a side, near the pixel circuit, of the undercut structure ranges from 0.3 μm to 3 μm.

Further, in the direction parallel to the barrier layer, the width of side erosion of the undercut structure ranges from 0.3 μm to 3 μm. For such a structure, when the light emitting layer is subjected to evaporation, the light emitting layer will be disconnected at the position of the undercut structure due to the good verticality of the evaporated film, while the thin film encapsulation layer will grow along the structure, so that the thin film encapsulation layer can cover a surface of the light emitting layer and the position where the light emitting layer is disconnected, ensuring the encapsulation of a side face of the light emitting layer.

Optionally, in the method for preparing the organic light-emitting display panel provided by the embodiment of the present disclosure, the substrate may be a flexible substrate.

Specifically, the material of the flexible substrate can be polyimide which has excellent thermal stability, chemical corrosion resistance, and mechanical properties, and can ensure a longer service life.

Optionally, in the method for preparing the organic light-emitting display panel provided by the embodiment of the present disclosure, an inorganic insulating layer in the pixel circuit may be reused as the barrier layer. The inorganic insulating layer in the embodiment of the present disclosure may be a gate insulating layer, an interlayer insulating layer, or a passivation layer.

Specifically, the material of the barrier layer is a silicon nitride material or a silicon oxide material. The silicon nitride material or the silicon oxide material has good water resistance and can effectively block external moisture, oxygen and corrosive substances, thereby ensuring the water and oxygen resistance of the substrate.

Optionally, in the method for preparing the organic light-emitting display panel provided by the embodiment of the present disclosure, the thin film encapsulation layer includes at least one organic layer and at least one inorganic layer which are alternately stacked. The organic layer and the inorganic layer are arranged to block most external moisture, and meanwhile make the thin film encapsulation layer flat, thus improving an encapsulation effect of the thin film encapsulation layer.

As a practical example of the above-mentioned thin film encapsulation layer, the thin film encapsulation layer 7 may include a first inorganic layer 71, an organic layer 72, and a second inorganic layer 73 located on a side, facing away from the first inorganic layer 71, of the organic layer 72. As the major effect of the organic layer on the thin film encapsulation layer is to improve planeness and reduce mechanical damage, and the light emitting layer is disconnected at the position of the undercut structure, the organic layer is omitted and the material is saved. Therefore, as shown in FIG. 3e, FIGS. 4-5, the thin film encapsulation layer 7 may only include a first inorganic layer 71 and a second inorganic layer 73 located on a side, facing away from the light emitting layer 4, of the first inorganic layer 71.

Optionally, in the method for preparing the organic light-emitting display panel provided by the embodiment of the present disclosure, the forming the thin film encapsulation layer on the light emitting layer specifically includes:

forming the first inorganic layer on the light emitting layer by a vapor deposition method;

forming the organic layer on the first inorganic layer by means of ink-jet printing; and forming the second inorganic layer on the organic layer by the vapor deposition method.

Of course, the first inorganic layer, the organic layer and the second inorganic layer may be formed sequentially by other methods than the above-mentioned preparation process, and the above-mentioned films may be formed by an appropriate process according to actual needs, which is not specifically limited here.

Based on the same inventive concept, an embodiment of the present disclosure also provides an organic light-emitting display panel formed by the above preparation method, including:

a substrate, where the substrate includes a non-display area and a display area surrounding the non-display area;

a barrier layer, where the barrier layer is located on the substrate, and the non-display area includes at least one via hole, where a position, corresponding to the via hole, of the substrate includes a groove, and the groove and the barrier layer form an undercut structure;

a pixel circuit, where an orthographic projection of the pixel circuit on the substrate and an orthographic projection of the non-display area on the substrate do not overlap;

a light emitting layer, where the light emitting layer is located on a side, facing away from the substrate, of the pixel circuit, and the light emitting layer is disconnected at a side wall of the undercut structure; and a thin film encapsulation layer, where the thin film encapsulation layer covers the light emitting layer and the side wall of the undercut structure and is continuously arranged.

Specifically, by etching the substrate to form the undercut structure, as the light emitting layer is disconnected at the position of the undercut structure and the thin film encapsulation layer grows along the undercut structure, thus the thin film encapsulation layer can cover both the surface and the disconnected position of the light emitting layer, thereby blocking the path of water vapor entering the light emitting layer, improving the water and oxygen resistance of the light emitting layer, and ensuring the encapsulation layer on a side face of the light emitting layer, so as to ensure the encapsulation reliability of a device.

Optionally, in the organic light-emitting display panel provided by the embodiment of the present disclosure, the thickness of the groove may range from 20% to 80% of a thickness of the substrate.

Specifically, according to the overall thickness of the substrate, in a direction perpendicular to the barrier layer, the thickness of the groove can range from 2 µm to 5 µm. In the solution provided by the present disclosure, since the undercut structure is formed by etching the substrate with a mask, the etching thickness ranging from 2 µm to 5 µm can better control an etching speed and an etching end point, so as to ensure that underlying materials are not damaged. Of course, when the overall thickness of the substrate changes, the thickness of the groove will also change accordingly, and the specific thickness of the groove is not limited here.

Optionally, in a direction parallel to the barrier layer, a width of side erosion of a side, near the pixel circuit, of the undercut structure ranges from 0.3 µm to 3 µm. For such a structure, when the light emitting layer is subjected to evaporation, the light emitting layer will be disconnected at the position of the undercut structure due to the good verticality of an evaporated film, while the thin film encapsulation layer will grow along the structure, so that the thin film encapsulation layer can cover a surface of the light emitting layer and the position where the light emitting layer is disconnected, ensuring the encapsulation of a side face of the light emitting layer.

Optionally, the thin film encapsulation layer includes at least one organic layer and at least one inorganic layer which are alternately stacked. The organic layer and the inorganic layer are arranged to block most external moisture, and also make the thin film encapsulation layer flat, thus improving the encapsulation effect of the thin film encapsulation layer.

As a practical example of the above-mentioned thin film encapsulation layer, the thin film encapsulation layer includes a first inorganic layer, an organic layer, and a second inorganic layer located on a side, facing away from the first inorganic layer, of the organic layer. As the major effect of the organic layer on the thin film encapsulation layer is to improve planeness and reduce mechanical damage, and the light emitting layer is disconnected at the position of the undercut structure, the organic layer is omitted at the position of the undercut structure and the material is saved.

Based on the same inventive concept, an embodiment of the present disclosure also provides a display device which includes the organic light-emitting display panel provided by any one of the above-mentioned embodiments, and functional devices embedded in the organic light-emitting display panel, such as a front camera, a photosensitive device, and a face recognition device.

The display device may be a mobile phone, a notebook, a display, a television and the like. Moreover, the display device has all the advantages of the organic light-emitting display panel provided by any one of the above-mentioned embodiments, and the principle and specific implementation of the display device are the same as those of the organic light-emitting display panel, so that the display device can be implemented with reference to the embodiments of the organic light-emitting display panel, which will not be repeated here.

The embodiments of the present disclosure provide the organic light-emitting display panel, the method for preparing the same and the display device. By etching the substrate to form the undercut structure, as the light emitting layer is disconnected at the position of the undercut structure and the thin film encapsulation layer grows along the undercut structure, thus the thin film encapsulation layer can cover the surface and the disconnected position of the light emitting layer, thereby blocking the path of water vapor entering the light emitting layer, improving the water and oxygen resistance of the light emitting layer, and meanwhile ensuring the encapsulation layer on the side face of the light emitting layer, so as to ensure the encapsulation reliability of a device.

Obviously, those skilled in the art can make various changes and modifications to the embodiments of the present disclosure without departing from the spirit and scope of the present disclosure. Thus, the present disclosure is also intended to include the modifications and variations if the modifications and variations fall within the scope of the claims of the present disclosure and their equivalents.

What is claimed is:

1. A method for preparing an organic light-emitting display panel, comprising:
   providing a substrate, wherein the substrate comprises a non-display area and a display area surrounding the non-display area;
   forming a barrier layer on the substrate and forming a pixel circuit on the barrier layer, wherein an orthographic projection of the pixel circuit on the substrate and an orthographic projection of the non-display area on the substrate do not overlap;
   patterning the barrier layer in the non-display area to form at least one via hole penetrating the barrier layer;
   patterning the substrate by using the barrier layer as a mask in the non-display area to form a groove; wherein the groove is in a position corresponding to the via hole on the substrate, an opening width of a side of the groove close to the barrier layer is larger than a width of the via hole, and the groove and the barrier layer form an undercut structure;
   forming a light emitting layer on the pixel circuit, wherein the light emitting layer is disconnected at a side wall of the undercut structure; and
   forming a thin film encapsulation layer covering the light emitting layer and the side wall of the undercut structure on the light emitting layer;
   wherein a position of an opening of the undercut structure is configured to be cut to form a camera area, and an edge of camera area falls into the undercut structure;
   wherein a disconnected part, arranged in the undercut structure, of the light emitting layer contacts a bottom of the undercut structure.

2. The method according to claim 1, wherein said forming the pixel circuit on the substrate comprises:
   forming a plurality of films of the pixel circuit on the substrate, and sequentially patterning the plurality of films, wherein the plurality of films comprise a metal layer, a semiconductor layer and an insulating layer;
   wherein in the non-display area, the metal layer is removed in an exposure process.

3. The method according to claim 1, wherein said patterning the substrate by using the barrier layer as a mask comprises:
   etching the substrate in a dry etching process by using the barrier layer as the mask.

4. The method according to claim 1, wherein said forming the light emitting layer on the pixel circuit comprises:
   forming the light emitting layer on the pixel circuit by an evaporation method.

5. The method according to claim 1, wherein the thin film encapsulation layer comprises at least one organic layer and at least one inorganic layer which are alternately stacked.

6. The method according to claim 5, wherein the thin film encapsulation layer comprises a first inorganic layer, an organic layer, and a second inorganic layer arranged on a side, facing away from the first inorganic layer, of the organic layer; and said forming the thin film encapsulation layer on the light emitting layer comprises:

forming the first inorganic layer on the light emitting layer by a vapor deposition method;

forming the organic layer on the first inorganic layer by means of ink-jet printing; and forming the second inorganic layer on the organic layer by the vapor deposition method.

7. The method according to claim 1, wherein in a direction perpendicular to the barrier layer, a thickness of the groove ranges from 2 μm to 5 μm, or the thickness of the groove ranges from 20% to 80% of a thickness of the substrate.

8. The method according to claim 1, wherein in a direction parallel to the barrier layer, a width of side erosion of a side, near the pixel circuit, of the undercut structure ranges from 0.3 μm to 3 μm.

9. The method according to claim 1, wherein the substrate is a flexible substrate.

10. The method according to claim 1, wherein an inorganic insulating layer in the pixel circuit is reused as the barrier layer.

11. The method according to claim 1, wherein a material of the barrier layer is a silicon nitride material or a silicon oxide material.

12. An organic light-emitting display panel, comprising:

a substrate, wherein the substrate comprises a non-display area and a display area surrounding the non-display area;

a barrier layer, wherein the barrier layer is arranged on the substrate, and the non-display area comprises at least one via hole, wherein a position, corresponding to the via hole, of the substrate comprises a groove, and the groove and the barrier layer form an undercut structure;

a pixel circuit, wherein an orthographic projection of the pixel circuit on the substrate and an orthographic projection of the non-display area on the substrate do not overlap;

a light emitting layer, wherein the light emitting layer is arranged on a side, facing away from the substrate, of the pixel circuit, and the light emitting layer is disconnected at a side wall of the undercut structure; and a thin film encapsulation layer, wherein the thin film encapsulation layer covers the light emitting layer and the side wall of the undercut structure;

wherein a position of an opening of the undercut structure is configured to be cut to form a camera area, and an edge of camera area falls into the undercut structure;

wherein a disconnected part, arranged in the undercut structure, of the light emitting layer contacts a bottom of the undercut structure.

13. The organic light-emitting display panel according to claim 12, wherein in a direction perpendicular to the barrier layer, a thickness of the groove ranges from 2 μm to 5 μm, or the thickness of the groove ranges from 20% to 80% of a thickness of the substrate.

14. The organic light-emitting display panel according to claim 12, wherein in a direction parallel to the barrier layer, a width of side erosion of a side, near the pixel circuit, of the undercut structure ranges from 0.3 μm to 3 μm.

15. The organic light-emitting display panel according to claim 12, wherein the thin film encapsulation layer comprises at least one organic layer and at least one inorganic layer which are alternately stacked.

16. A display device, comprising the organic light-emitting display panel according to claim 12.

* * * * *